(12) United States Patent
Temmler et al.

(10) Patent No.: US 6,326,262 B1
(45) Date of Patent: Dec. 4, 2001

(54) METHOD FOR FABRICATING EPITAXY LAYER

(75) Inventors: Dietmar Temmler, Dresden; Herbert Benzinger, München; Wolfram Karcher, Weissig; Catharina Pusch, München; Martin Schrems, Langebrück; Jürgen Faul, Radebeul, all of (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/651,492

(22) Filed: Aug. 30, 2000

(30) Foreign Application Priority Data

Aug. 30, 1999 (DE) .............................. 199 41 147

(51) Int. Cl.$^7$ .............................. H01L 21/8242
(52) U.S. Cl. .................. 438/245; 438/222; 438/481
(58) Field of Search .................. 438/242–247, 438/388–392, 44, 222, 226, 269, 361, 357–363, 413, 416, 429, 442, 481

(56) References Cited

U.S. PATENT DOCUMENTS

| | | |
|---|---|---|
| 4,649,625 | 3/1987 | Lu . |
| 4,952,526 * | 8/1990 | Pribat et al. . |
| 5,065,273 | 11/1991 | Rajeevakumar . |
| 5,250,829 | 10/1993 | Bronner et al. . |
| 5,512,767 | 4/1996 | Noble, Jr. . |
| 5,641,694 | 6/1997 | Kenney . |
| 5,658,816 | 8/1997 | Rajeevakumar . |
| 5,691,549 | 11/1997 | Lam et al. . |
| 5,736,760 | 4/1998 | Hieda et al. . |
| 5,744,386 | 4/1998 | Kenney . |
| 5,843,820 | 12/1998 | Lu . |
| 5,869,868 | 2/1999 | Rajeevakumar . |
| 6,207,494 * | 3/2001 | Graimann et al. ............ 438/248 |

OTHER PUBLICATIONS

N.C.C. Lu et al.: "A Buried–Trench DRAM Cell Using a Self–aligned Epitaxy Over Trench Technology", IEDM 88, pp. 588–591.

* cited by examiner

Primary Examiner—Jey Tsai
(74) Attorney, Agent, or Firm—Herbert L. Lerner; Laurence A. Greenberg; Werner H. Stemer (57) ABSTRACT

A method of fabricating an epitaxial layer includes providing a substrate having a substrate surface with an at least partly uncovered monocrytalline region, and at least one electrically insulating region adjoining the monocrystalline region and being at least partly surrounded by the monocrystalline region. An epitaxial layer is grown on the monocrystalline region. The electrically insulating region is at least partly overgrown laterally with the epitaxial layer, thereby forming an epitaxial closing joint above the electrically insulating region due to the overgrowth. The epitaxial layer is at least partly removed above the electrically insulating region, thereby the epitaxial closing joint is at least partly removed.

10 Claims, 9 Drawing Sheets

METHOD FOR FABRICATING EPITAXY LAYER

BACKGROUND OF THE INVENTION

Field of the Invention

The present invention relates to an epitaxial layer and a corresponding fabrication method.

The present invention is explained with regard to an epitaxial layer that is used in a DRAM memory cell. For discussion purposes, the invention is described in respect of the formation of the epitaxial layer of an individual memory cell with a trench capacitor and a transistor.

Integrated circuits (ICs) or chips contain epitaxial layers for arranging and adding monocrystalline materials, such as monocrystalline silicon, for example. In addition, integrated circuits contain capacitors for the purpose of storing charge, such as, for example, a dynamic random access memory (DRAM). In this case, the charge state in the capacitor represents a data bit.

A DRAM chip contains a matrix of memory cells which are arranged in the form of rows and columns and are addressed by word lines and bit lines. The reading of data from the memory cells or the writing of data to the memory cells is realized by activating suitable word lines and bit lines.

A DRAM memory cell usually contains a transistor connected to a capacitor. The transistor comprises, inter alia, two diffusion regions isolated from one another by a channel which is driven by a gate. Depending on the direction of current flow, one diffusion region is referred to as the drain and the other as the source. The source region is connected to a bit line, the drain region is connected to the trench capacitor and the gate is connected to a word line.

By the application of suitable voltages to the gate, the transistor is controlled in such a way that a current flow between the drain region and the source region through the channel is switched on and off. The channel is usually formed in a monocrystalline silicon, in order that the pn junctions with the source region and the drain region are formed in such a way that a leakage current through the transistor in the off state is as small as possible. Monocrystalline silicon is provided on the one hand by the substrate which is generally formed in monocrystalline fashion. Monocrystalline silicon can additionally be fabricated by epitaxial growth on monocrystalline silicon in such a way that it is formed at a position on the substrate where it was not originally arranged.

The charge stored in the capacitor decreases over time on account of leakage currents. Before the charge has decreased to a level below a threshold value, the storage capacitor must be refreshed. For this reason, these memories are referred to as dynamic RAM (DRAM).

The central problem in known DRAM variants based on a trench capacitor is the production of a sufficiently large capacitance for the trench capacitor. This problem will be aggravated in future by the advancing miniaturization of semiconductor components. The increase in the integration level means that the area available per memory cell and thus the capacitance of the trench capacitor decrease ever further.

Sense amplifiers require a sufficient signal level for reliably reading out the information situated in the memory cell. The ratio of the storage capacitance to the bit line capacitance is crucial in determining the signal level. If the storage capacitance is low, said ratio may be too small for generating an adequate signal.

A lower storage capacitance likewise requires a higher refresh frequency, because the quantity of charge stored in the trench capacitor is limited by its capacitance and additionally decreases due to leakage currents. If the quantity of charge falls below a minimum quantity of charge in the storage capacitor, then it is no longer possible for the information stored therein to be read out by the connected sense amplifiers, the information is lost and read errors arise.

One way of avoiding read errors is to reduce the leakage currents. Leakage currents can be reduced on the one hand by transistors and on the other hand by dielectrics, such as the capacitor dielectric, for example. An undesirably reduced retention time can be lengthened by these measures.

Stacked capacitors or trench capacitors are usually used in DRAMs. Examples of DRAM memory cells having a trench capacitor are given in the patents U.S. Pat. No. 5,658,816, U.S. Pat. No. 4,649,625, U.S. Pat. No. 5,512,767, U.S. Pat. No. 5,641,694, U.S. Pat. No. 5,691,549, U.S. Pat. No. 5,065,273, U.S. Pat. No. 5,736,760, U.S. Pat. No. 5,744,386 and U.S. Pat. No. 5,869,868. A trench capacitor has a three-dimensional structure which is formed in a silicon substrate, for example. An increase in the capacitor electrode area and thus in the capacitance of the trench capacitor can be achieved for example by etching more deeply into the substrate and thus by deeper trenches. In this case, the increase in the capacitance of the trench capacitor does not cause the substrate surface occupied by the memory cell to be enlarged. However, this method is also limited, since the attainable etching depth of the trench capacitor depends on the trench diameter, and, during fabrication, it is only possible to attain specific, finite aspect ratios between the trench depth and trench diameter.

As the increase in the integration level advances, the substrate surface available per memory cell decreases ever further. The associated reduction in the trench diameter leads to a reduction in the capacitance of the trench capacitor. If the capacitance of the trench capacitor is dimensioned to be so low that the charge which can be stored is insufficient for entirely satisfactory readout by the sense amplifiers connected downstream, then this results in read errors.

This problem is solved for example in the publication N. C. C. Lou, IEDM 1988, page 588 et seq. by the transistor, which is usually situated next to the trench capacitor, being moved to a position situated above the trench capacitor (SEOT memory cell: self-aligned epitaxy over trench cell). As a result, the trench can take up a part of the substrate surface which is conventionally reserved for the transistor. Through this arrangement, the trench capacitor and the transistor share part of the substrate surface. This arrangement is made possible by an epitaxial layer grown above the trench capacitor. To ensure that the epitaxial layer which is to be formed above the trench capacitor is electrically insulated from the trench capacitor, there must be an insulating layer between the epitaxial layer and the trench capacitor. This means that the substrate surface on which the epitaxial layer is grown comprises monocrystalline silicon and an insulating region. The epitaxial layer is grown on the monocrystalline silicon substrate surface and at the same time grows over the insulating region from the sides with monocrystalline silicon. For example, the overgrowth of an oxide region with monocrystalline silicon is described in the abovementioned publication. Above the insulation region, the growth directions of the silicon epitaxy collide and form an epitaxial closing joint. The epitaxial closing joint does not grow together in monocrystalline fashion. What are produced, rather, are dislocations and grain boundaries which are typical of polycrystalline silicon.

What is problematic in this case is that considerable doping fluctuations can arise at the epitaxial closing joint during the overgrowth of the insulator layer. In this case, the doping of the epitaxial closing joint is usually higher than in adjacent regions. As a result, the electrical properties of the region in which the epitaxial closing joint is situated are altered in an undesirable manner.

What has a significantly more serious effect, however, is the fact that pn junctions traversed by the epitaxial closing joint can result in an increased leakage current. Since a transistor is formed in the silicon epitaxial layer, said transistor being used as a selection transistor for DRAM memory cells, leakage currents through the selection transistor must be extremely small because otherwise the DRAM memory cell discharges on account of the leakage currents and is unusable.

A further problem is constituted by the crystal defects at the epitaxial closing joint, which can propagate further in subsequent processing steps, such as thermal steps for example, and thus enlarge the damage region.

SUMMARY OF THE INVENTION

The object of the present invention consists, therefore, in forming a reliable epitaxial layer.

This object is achieved according to the invention by the method for fabricating an epitaxial layer which comprises the following steps:

providing a substrate having a substrate surface formed with an, at least partly uncovered, monocrystalline region and at least one electrically insulating region adjoining the monocrystalline region and being at least partly surrounded by the monocrystalline region;

growing an epitaxial layer on the monocrystalline region of the substrate surface, and at least partly overgrowing the electrically insulating region laterally with the epitaxial layer and thereby forming an epitaxial closing joint above the electrically insulating region on account of the overgrowth; and at least partly removing the epitaxial layer above the electrically insulating region and thereby also at least partly removing the epitaxial closing joint.

The respective subclaims relate to preferred developments.

The idea on which the present invention is based consists in a method for fabricating an epitaxial layer. The removal of the epitaxial closing joint which is produced during the overgrowth of an electrically insulating layer from approximately opposite sides.

In this case, it is advantageous for the crystal defects of the epitaxial growth fronts that meet one another to be at least partly removed.

In a further advantageous embodiment of the invention, in order to remove the crystal defects, part of the epitaxial layer is removed by an anisotropic etching step.

According to the invention, the monocrystalline region may be silicon and the electrically insulating region may be silicon oxide.

A fabrication method for forming a memory with a trench capacitor uses, inter alia, the steps of: providing a substrate having a surface, forming a trench in the substrate, forming a large insulation collar in an upper region of the trench, forming a buried plate as outer capacitor electrode, forming a dielectric layer in the trench, filling the trench with a conductive trench filling, and forming an insulating covering layer on the conductor trench filling. In this case, the insulating covering layer is the electrically insulated region of the substrate surface. The following steps are also carried out: growing an epitaxial layer on the surface of the substrate and over the insulating covering layer, forming trench insulation (STI), forming a first and a second word line, forming a first insulation encapsulation around the first word line and a second insulation encapsulation around the second word line, and forming a contact trench. In an advantageous instance of the method according to the invention, a contact trench is changed in such a way that part of the epitaxial closing joint is removed.

A further advantageous method carries out in situ doping of the epitaxial layer. As a result, the channel doping of the transistor and the well doping can be set as early as during the growth of the epitaxial layer. Furthermore, the formation of doping profiles with very steep slopes is made possible, which lead to small leakage currents and make the components scaleable.

In a further advantageous instance of the method according to the invention, an epitaxial closing joint is formed in the epitaxial layer, which is at least partly removed through the trench insulation and/or through the contact trench. Moreover, it is advantageous to orient the layout of the trench to a crystal orientation of the substrate in such a way that the epitaxial closing joint becomes as small as possible.

Furthermore, it is advantageous to treat the epitaxial layer with a thermal step which reduces the defects in the epitaxial layer and anneals the epitaxial closing joint. In this case, the crystal structure of the epitaxial closing joint is as far as possible completely reconstructed.

Furthermore, it is advantageous to treat the epitaxial layer with a planarization step which smooths and partly etches back the surface of the epitaxial layer.

BRIEF DESCRIPTION OF THE DRAWINGS

Exemplary embodiments of the present invention are illustrated in the drawings and are explained in more detail below. In the figures.

DESCRIPTION OF THE PREFERRED EMBODIMENT

In the figures, identical reference symbols designate identical or functionally identical elements.

Figure 1:
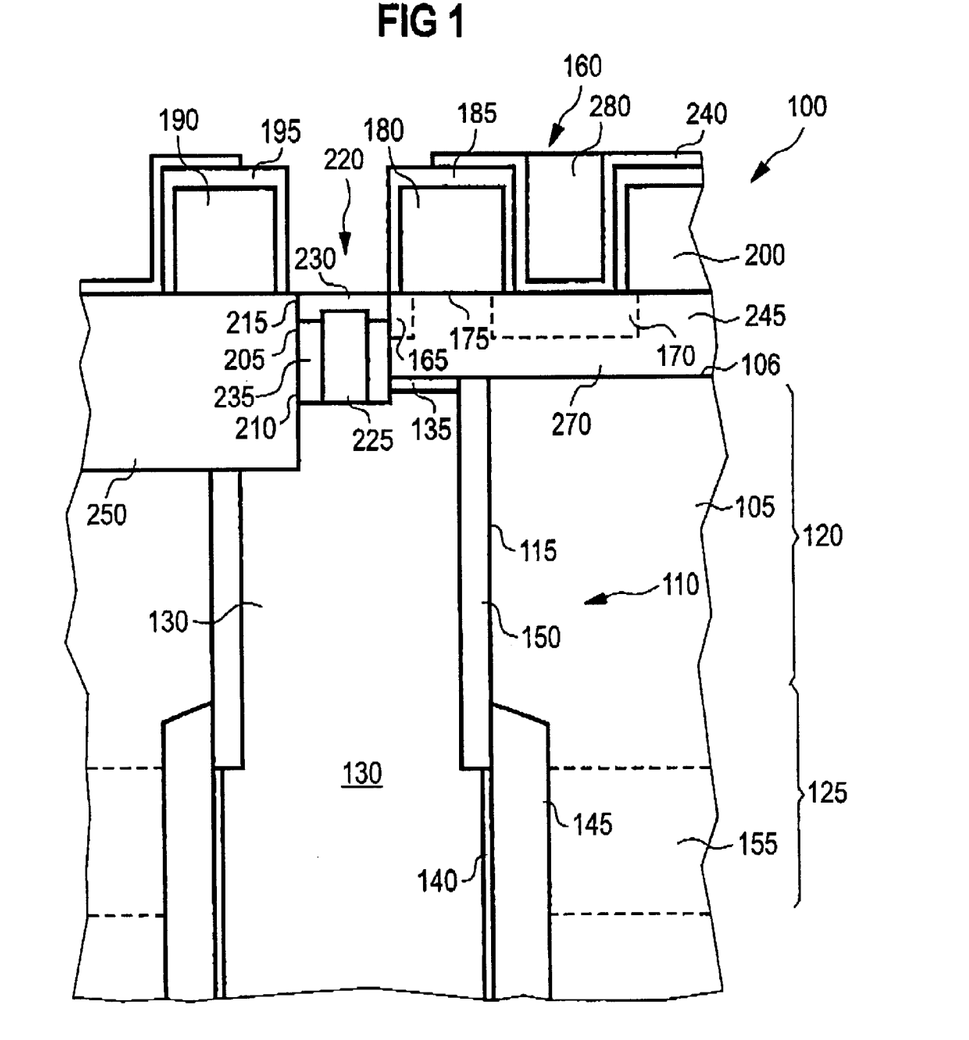
FIG. 1 shows an exemplary embodiment of a DRAM memory cell according to the present invention, corresponding to a first embodiment of the method according to the invention.

A first embodiment of a memory cell with a trench capacitor is shown with reference to FIG. 1. A memory cell 100 comprises a trench capacitor 110 and a transistor 160. The trench capacitor 110 is formed in a substrate 105 having a surface 106. A buried well 155, which is composed of n-doped silicon for example, is introduced in the substrate 105, which is composed of p-doped silicon for example. Boron, arsenic or phosphorus are suitable dopants for doping silicon. The trench capacitor 110 has a trench 115 with an upper region 120 and a lower region 125. A large insulation collar 150 is situated in the upper region 120 of the trench 115. The lower region 125 of the trench at least partly penetrates the buried well 155. A buried plate 145 is arranged around the lower region 125 of the trench 115, which plate forms the outer capacitor electrode of the trench capacitor 110. The buried plates of the adjacent memory cells are electrically connected to one another by the buried well 155. The buried plate 145 is composed of n-doped silicon for example.

The lower region 125 of the trench 115 is lined with a dielectric layer 140, which forms the storage dielectric of the trench capacitor 110. The dielectric layer 140 may be fabricated from layers or layer stacks comprising silicon oxide, silicon nitride or silicon oxynitride. It is also possible to use storage dielectrics which have a high dielectric constant, such as, for example, tantalum oxide, titanium oxide, BST (barium strontium titanate), and any other suitable dielectric.

The trench 115 is filled with a conductive trench filling 130, which forms the inner capacitor electrode and is composed of doped polysilicon for example. An insulating cover layer 135, which is composed of silicon oxide for example, is situated above the conductive trench filling 130. In this exemplary embodiment, the insulating covering layer 135 is the electrically insulating region 108. Furthermore, a self-aligned connection 220 is situated above the conductive trench filling 130, which connection is arranged in a contact trench 205 having an upper region 215 and a lower region 210. The lower region of the contact trench 205 is lined with an insulation collar 235 and at the same time surrounds the conductive material 225 arranged on the conductive trench filling 130. A conductive cap 230 is arranged above the insulation collar 235 and the conductive material 225 in the contact trench 205.

The conductive material 225 and the conductive cap 230 are composed of doped polysilicon for example. The insulation collar 235 is composed of silicon oxide for example.

An epitaxial layer 245 is situated above the insulating covering layer 135, which forms the electrically insulating region 108, and above the substrate 105, which forms the monocrystalline region 107 in this case. The transistor 160 is formed in the epitaxial layer 245. The transistor 160 comprises a drain region 165 connected to the conductive cap 230. Furthermore, the transistor 160 comprises a source region 170 and a channel 175, which are likewise formed in the epitaxial layer 245. The source region 170 and the drain region 165 are formed from doped silicon for example.

Situated above the channel 175 of the transistor 160 is a first word line 180, which is lined by a first insulation encapsulation 185 composed of silicon nitride for example. A trench insulation 250 is arranged above the trench 115, next to the contact trench 205. The trench insulation 250 is composed of silicon oxide in this exemplary embodiment. The position of the trench insulation is explained in more detail with reference to FIG. 2. A second word line 190, which is lined by a second insulation encapsulation, runs above the trench insulation 250. A third word line 200 runs next to the first word line 180. A stop layer 240 is arranged above the word line and the source region 170, which layer is removed between the first and the second word lines. The stop layer protects the region between the first word line 180 and the third word line 200.

An active region 270 is surrounded all around by the trench insulation 250 and is situated in the epitaxial layer 245.

Figure 2:
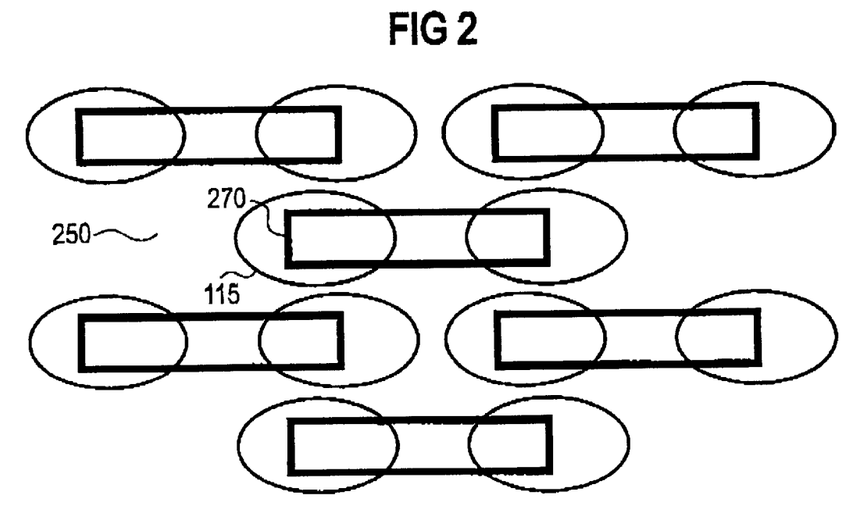
FIG. 2 shows the plan view of the exemplary embodiment of a DRAM memory cell array in accordance with FIG. 1.

FIG. 2 shows the plan view of the exemplary embodiment of the memory cell according to the invention which is shown in FIG. 1. The active region 270 is surrounded all around by the trench insulation 250. The trench 115 is situated at one end of the active region 270.

Figure 3:
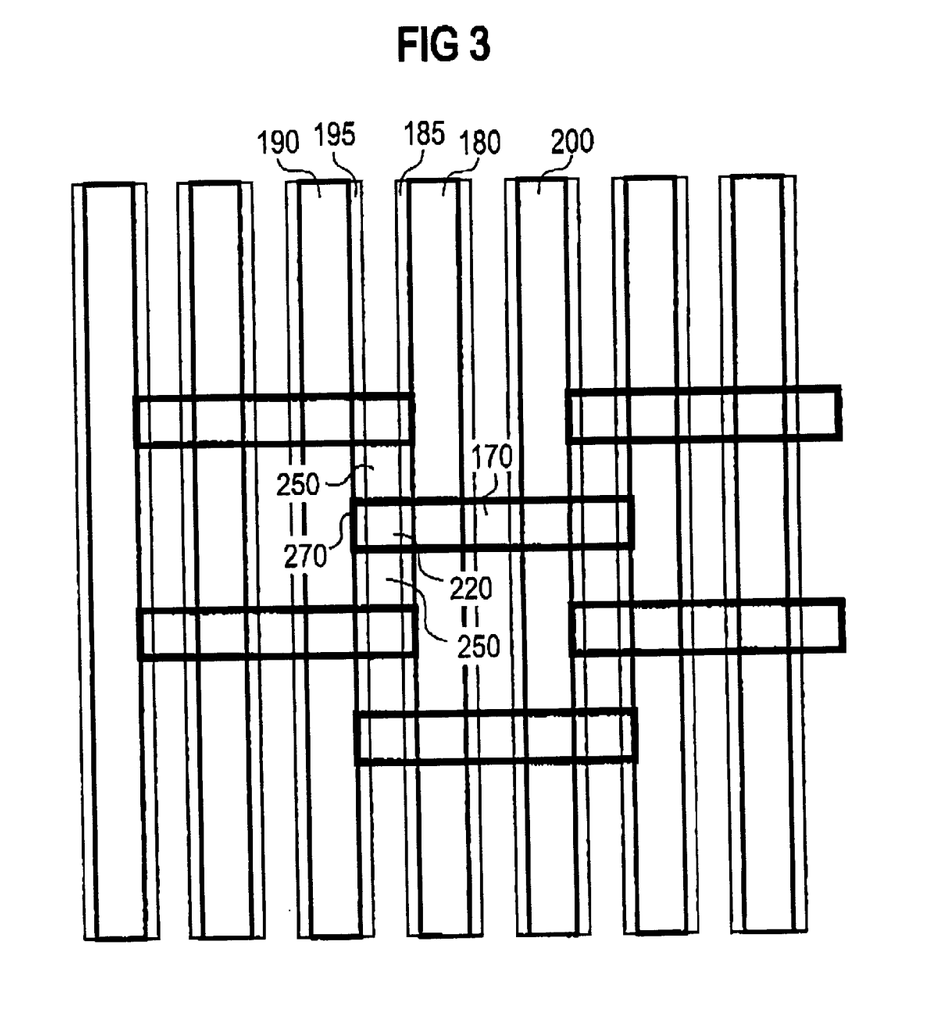
FIG. 3 shows a further plan view of the exemplary embodiment of a DRAM memory cell array in accordance with FIG. 1.

FIG. 3 illustrates a further plan view of the memory cell illustrated in FIG. 1. For the sake of clarity, the trench 115 is not depicted, but is situated at the position shown in FIG. 2. In FIG. 3, the first word line 180 with its first insulation encapsulation 115 runs over the active region 270. The second word line 190 with its second insulation encapsulation runs over the trench insulation 250. The self-aligned connection 220 is bounded by the first word line 180 with first insulation encapsulation 185, by the second word line 190 with second insulation encapsulation 195 and by the trench insulation 250. In addition, the source region 170 is arranged between the trench insulation 250, the first word line 180 and the third word line 200.

Figure 4:
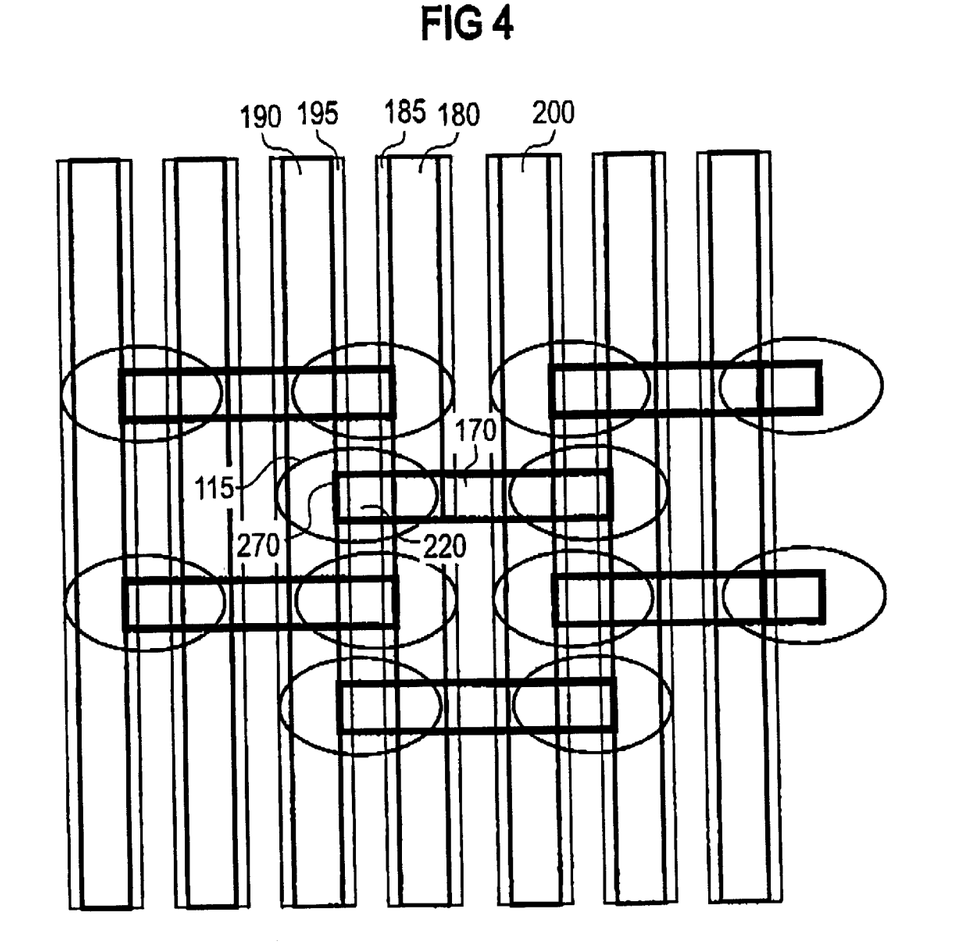
FIG. 4 shows a further plan view of the exemplary embodiment of a DRAM memory cell array in accordance with FIG. 1.

FIG. 4 illustrates a further plan view of the memory cell illustrated in FIG. 1. In contrast to FIG. 3, the position of the trench 115 is depicted.

Figure 5:
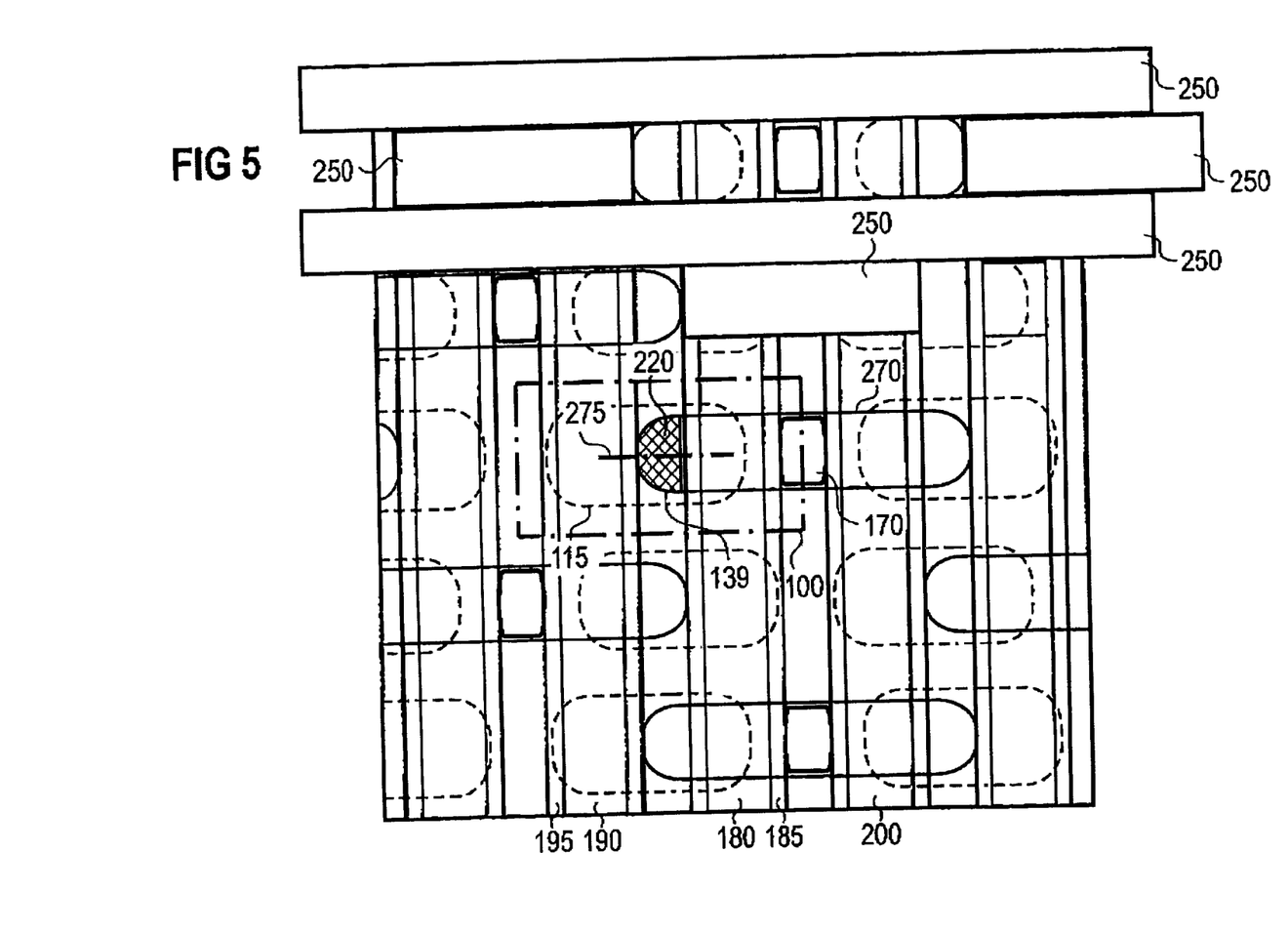
FIG. 5 shows a further plan view of the exemplary embodiment of a DRAM memory cell array in accordance with FIG. 1.

FIG. 5 shows a further plan view of the memory cell illustrated in FIG. 1. The size of the memory cell 100 is marked by a frame. This is an 8 $F^2$ cell, where F is the smallest lithographic dimension that can be attained. Within the frame marking the memory cell 100, a large part of the substrate surface 106 is used by the trench 115. In comparison with FIG. 4, the position of the epitaxial closing joint 275 is shown, which is formed on the insulating covering layer 135 in this exemplary embodiment.

The transistor 160 controlled by the first word line 180 and an adjacent transistor controlled by the third word line 200 both use the common source region 170, which is arranged between these two word lines.

In the upper region of FIG. 5, for the sake of clarity, the trench insulation 250 is shown without word lines which run on the trench insulation 250.

The method for fabricating the memory cell according to the invention is explained with reference to FIGS. 1 to 5. The substrate 105 is provided, in and on which the DRAM memory cell is to be fabricated. In the present variant, the substrate 105 is lightly doped with p-type dopants, such as boron for example. An n-doped, buried well 155 is formed to a suitable depth in the substrate 105. By way of example, phosphorus or arsenic can be used as the dopant for doping the buried well 155. The buried well 155 may be produced by implantation, for example, and forms a conductive connection between the buried plates of the adjacent capacitors. As an alternative, the buried well 155 may be formed by epitaxially grown, doped silicon layers or by a combination of crystal growth (epitaxy) and implantation. This technique is described in U.S. Pat. No. 5,250,829 by Bronner et al.

The trench 115 is formed using a suitable hard mask layer as an etching mask for a reactive ion etching step (RIE). The large insulation collar 150, which is composed of silicon oxide for example, is subsequently formed in the upper region 120 of the trench 115. The buried plate 145 is subsequently formed with n-type dopants, such as arsenic or phosphorus for example, as the outer capacitor electrode. The large insulation collar 150 in this case serves as a doping mask which restricts the doping to the lower region 125 of the trench 108. Vapor phase doping, plasma doping or plasma immersion ion implantation (PIII) can be used to form the buried plate 145. These techniques are described for example in Ransom et al., J. Electrochemical. Soc., Volume 141, No. 5 (1994), page 1378 et seq.; U.S. Pat. No. 5,344,381 and U.S. Pat. No. 4,937,205. Ion implantation using the large insulation collar 150 as a doping mask is likewise possible. As an alternative, the buried plate 145 can be formed using a doped silicate glass as a dopant source, such as ASG (arsenic silicate glass) for example. This variant is described for example in Becker et al., J. Electrochemical. Soc., Volume 136 (1989), page 3033 et seq. If doped silicate glass is used for doping, then it is removed after the formation of the buried plate 145.

A dielectric layer 140 is subsequently formed, which layer lines the lower region 125 of the trench 115. The dielectric layer 140 serves as a storage dielectric for separating the capacitor electrodes. The dielectric layer 140 comprises, for example, a silicon oxide, a silicon nitride, a silicon oxynitride or a layer stack made of silicon oxide and silicon nitride layers. Materials having a high dielectric content, such as tantalum oxide or BST for example, can also be used.

The conductive trench filling 130, which may be composed of doped polysilicon or amorphous silicon for example, is subsequently deposited in order to fill the trench 115. By way of example, CVD or other known process techniques can be used for this purpose.

The insulating covering layer 135 is formed on the conductive trench filling 130. This can be carried out for example by thermal oxidation of the conductive trench filling 130. It is also possible to deposit the insulating covering layer 135 onto the conductive trench filling 130. By way of example, CVD deposition methods can be used for this purpose. It is particularly advantageous to form the insulating covering layer 135 selectively on the conductive trench filling 161. The formation of the insulating covering layer 135 can be carried out selectively since, at this point in time, the hard mask layer used for etching the trench 115 is present on the substrate surface and thus only leaves free the region in which the insulating covering layer 135 is to be formed.

All layers situated on the surface 106 of the substrate 105 at this point in time are removed and the substrate 105 is cleaned. Afterwards, the epitaxial layer 245 is grown epitaxially and selectively on the monocrystalline region 107 of the substrate 105. During the growth of the epitaxial layer 245, the insulating covering layer 135 is overgrown with monocrystalline silicon. The insulating covering layer 135 is overgrown with monocrystalline silicon from all directions, as illustrated in FIG. 5. The epitaxial closing joint 275 is produced in the process.

The selective epitaxial growth is described for example in the publication by N. C. C. Lou, IEDM 1988, page 588 et seq., where there is the problem, however, that an epitaxial layer is grown in two steps with interruption of the epitaxy. During the interruption, process steps such as the etching of a window into an oxide layer are carried out. Etching damage occurs in the process and increases the defect risk for the epitaxial layer and leads to leakage currents. An additional difficulty consists in the performance of the second epitaxy step, in which growth is effected both on monocrystalline silicon and on polysilicon. This leads to crystal defects which propagate from the polycrystalline region into the monocrystalline region. The crystal defects are produced because the epitaxy is carried out both on monocrystalline silicon and on polycrystalline silicon. Since, in the publication, the grown polycrystalline "neck" is a functional part of the memory cell construction, the crystal defects cannot be avoided. This disadvantage is resolved according to the invention by the epitaxial closing joint 275 being at least partly removed.

The grown epitaxial layer 245 is subsequently etched back and planarized using an etching-back method and a CMP method (chemical mechanical polishing), respectively.

The trench insulation 250 is subsequently formed. For this purpose, the regions of the trench insulation which are marked in FIG. 2 are etched and filled with a dielectric material such as silicon oxide for example, and subsequently planarized. In this case, the active region 270 remains for the subsequent formation of the transistor 160. The trench insulation 250 is preferably fabricated in such a way that part of the epitaxial closing joint 275 is removed.

After the fabrication of the gate oxide, a doped polysilicon layer is deposited, from which the word lines are formed in a subsequent exposure and etching step. In this case, the first word line 180 is formed on the active region 270 and the second word line 190 is formed on the trench insulation 250. The first word line 180 is surrounded by a first insulation encapsulation 185, while the second word line 190 is surrounded by a second insulation encapsulation 195. The insulation encapsulations are composed of silicon nitride for example.

The drain region 165 and the source region 170 are subsequently formed by ion implantation. In this case, the word lines formed from polysilicon together with their insulation encapsulations serve as implantation mask. Since the first word line 180 is arranged in such a way that it partly runs perpendicularly above the insulating covering layer 135, part of the channel 175 of the transistor 160 is situated directly above the insulating covering layer 135, with the result that the transistor 160 is formed as a partial SOI transistor.

The stop layer 240 is subsequently deposited conformally, with the result that it covers the insulation encapsulations of the word lines. The stop layer 240 is formed from silicon nitride for example. Afterwards, an oxide layer is deposited and planarized back as far as the stop layer 240, thereby forming, for example, the insulation filling 280 between the first word line 180 and the third word line 200. A window is subsequently opened in the stop layer 240 by means of photolithography and etching. In this case, the stop layer 240 is removed between the first word line 180 and the second word line 190, above the drain region 165. By means of anisotropic plasma etching which is selective with respect to the trench insulation 250, composed of silicon oxide, and selective with respect to the first insulation encapsulation 185 and the second insulation encapsulation 195, composed of silicon nitride, the drain region 165 and the epitaxial layer 245 are etched down to the insulating covering layer 135. The etching stops on the insulating covering layer 135 on account of its selectivity. In addition, the etching is self-aligned since it is bounded laterally by the insulation encapsulations of the word lines and by the trench insulation 250. The remainder of the epitaxial closing joint 275 that was produced is preferably removed in the course of this etching.

The uncovered part of the insulating covering layer 135 is subsequently removed. This is carried out by means of selective etching which selectively removes the insulating covering layer 135, composed of silicon oxide. The selectivity is with respect to the conductive trench filling 130, composed of doped polysilicon, with respect to the epitaxial layer 245, composed of silicon, and with respect to the first and second insulation encapsulations 185 and 195 and the stop layer 240, composed of silicon nitride.

An insulation collar 143 is then formed in the lower region 210 of the contact trench 205. For this purpose, thermal oxidation is carried out and a silicon oxide layer is deposited, from which the insulation collar 235 is formed by anisotropic etching back (spacer technique). The conductive material 225 is subsequently formed in the insulation collar 235. The conductive material 225 is composed of doped polysilicon, for example, and can be deposited using a CVD method.

The insulation collar 235 is etched back selectively down to the depth of the drain region 165. After a cleaning step, the conductive cap 230 is deposited and thus makes contact with the drain region 165 and the conductive material 225. Consequently, the conductive trench filling 130 is electrically connected to the drain region 165 via the conductive material 225. In this arrangement, the conductive cap 230 and the conductive material 225 are insulated from the epitaxial layer 245 by the insulation collar 235, with the result that the trench capacitor cannot be discharged by leakage currents.

The method for fabricating a first variant of a memory with a self-aligned connection 220 is thus explained and the subsequent process steps serve to complete the memory with the functional elements known from the prior art in a customary manner.

Figure 6:
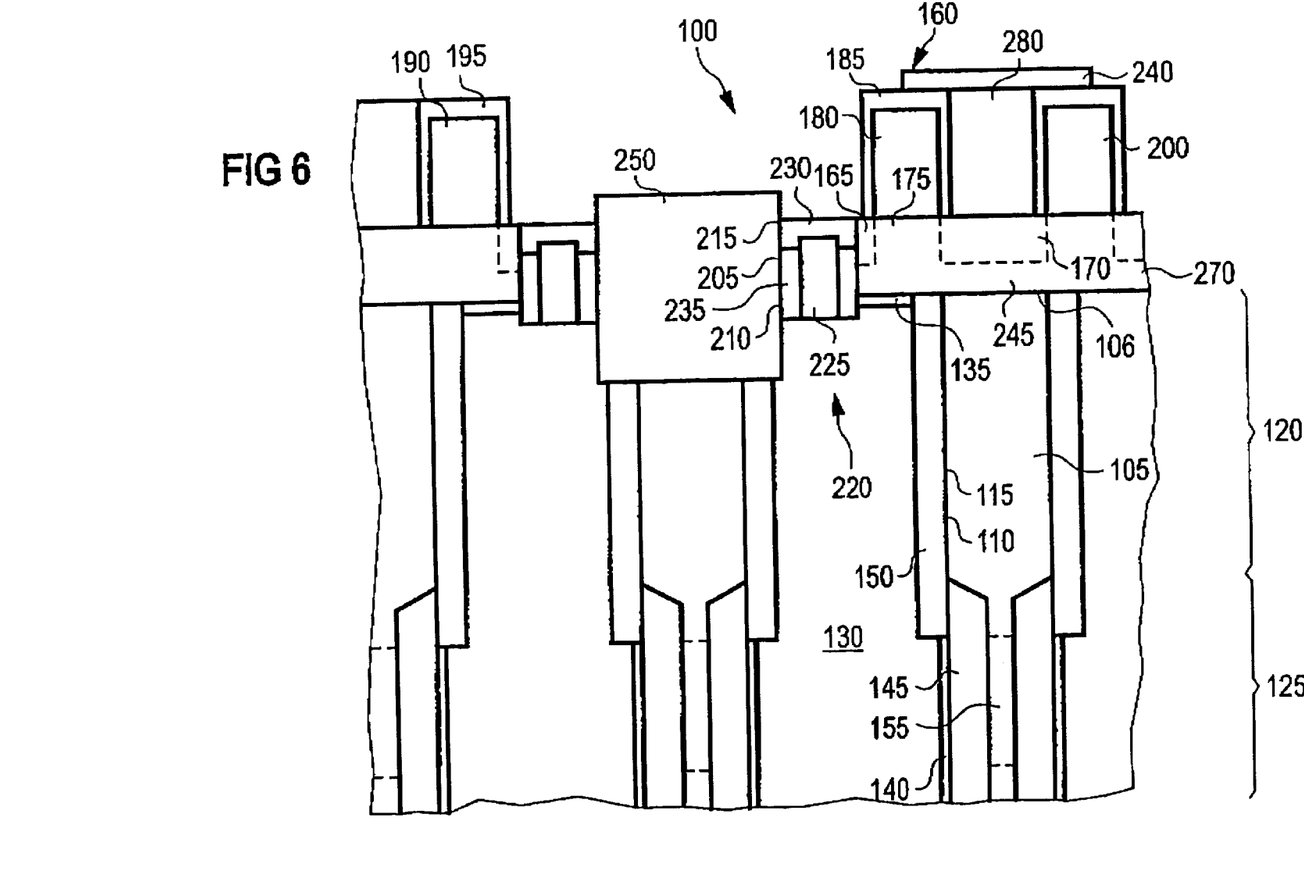
FIG. 6 shows a second exemplary embodiment of a DRAM memory cell according to the present invention, corresponding to a second embodiment of the method according to the invention.

FIG. 6 illustrates a further variant of a memory with a self-aligned connection. This is a one-transistor memory cell arrangement having a 4 F$^2$ cell layout having an open bit line architecture, having a trench capacitor and a partial SOI transistor. The memory cell 100 illustrated comprises a trench capacitor 110 and a transistor 160. The trench capacitor 110 is formed in and on a substrate 105. A buried well 155, which is composed of n-doped silicon for example, is introduced in the substrate 105. The trench capacitor 110 has a trench 115 having an upper region 120 and a lower region 125. A large insulation collar 150 is situated in the upper region 120 of the trench 115. The lower region 125 of the trench 115 at least partly penetrates the buried well 155. A buried plate 145 is arranged around the lower region 125 of the trench 115, which plate forms the outer capacitor electrode. The buried plates 145 of the adjacent memory cells are electrically connected to one another by the buried well 155. The lower region 125 of the trench 115 is lined with a dielectric layer 140, which forms the storage dielectric of the trench capacitor. The dielectric layer 140 may be fabricated from layers or layer stacks comprising silicon oxide, silicon nitride or silicon oxynitride. The trench 115 is filled with a conductive trench filling 130, which forms the inner capacitor electrode. The insulating covering layer 135 is situated above the conductive trench filling 130, within the large insulation collar 150.

The epitaxial layer 245 is situated on the insulating covering layer 135, on the large insulation collar 150 and on the substrate 105. The transistor 160 is formed in the epitaxial layer 245 and comprises a source region 170, a drain region 165 and a channel 175. Furthermore, the transistor 160 comprises a first word line 180, which controls the channel 175. The first word line 180 is lined with a first insulation encapsulation 185, composed of silicon nitride for example. The drain region 165 is electrically connected to the conductive trench filling 130 by a self-aligned connection 220. The self-aligned connection 220 comprises an insulation collar 235, a conductive material 225 situated within the insulation collar 235 and a conductive cap 230, which connects the conductive material 225 to the drain region 165. The insulation collar 235 is arranged in such a way that no leakage currents flow from the conductive trench filling 130, from the conductive material 225 or from the conductive cap 230 to the epitaxial layer 245.

The trench insulation 250 is situated between adjacent memory cells in order to electrically insulate said memory cells from one another. The course of the trench insulation 250 is described in more detail with reference to FIG. 8.

Figure 7:
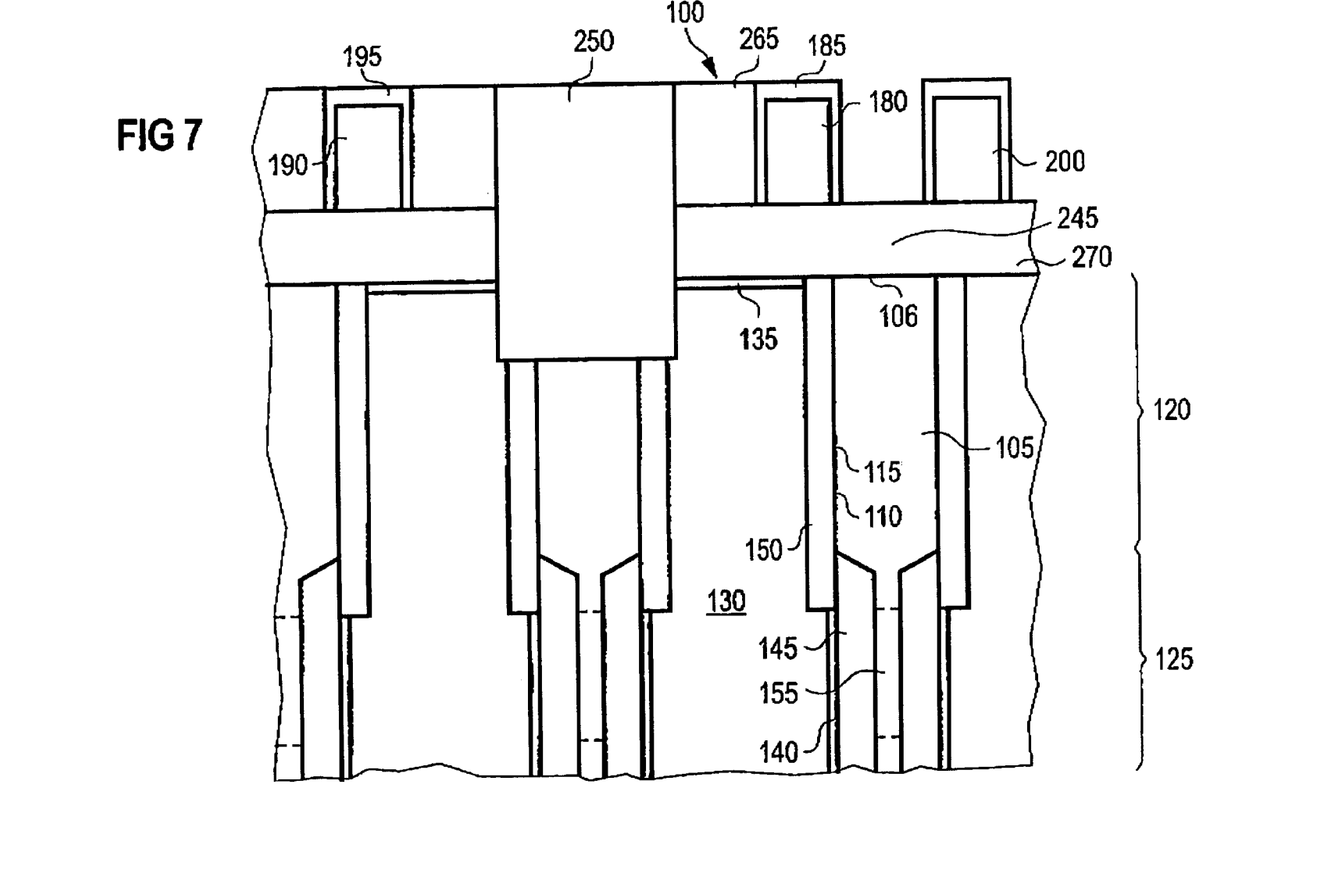
FIG. 7 shows an earlier processed stage of the exemplary embodiment according to FIG. 6.

FIG. 7 illustrates the cell arrangement according to FIG. 6 at an earlier process stage. The trench insulation 250 illustrated is a second trench insulation 260 running in the word line direction. Sacrificial spacer webs 265, composed of silicon oxide for example, are arranged on both sides of the trench insulation 260, which does not terminate with the surface of the epitaxial layer 245.

Figure 8:
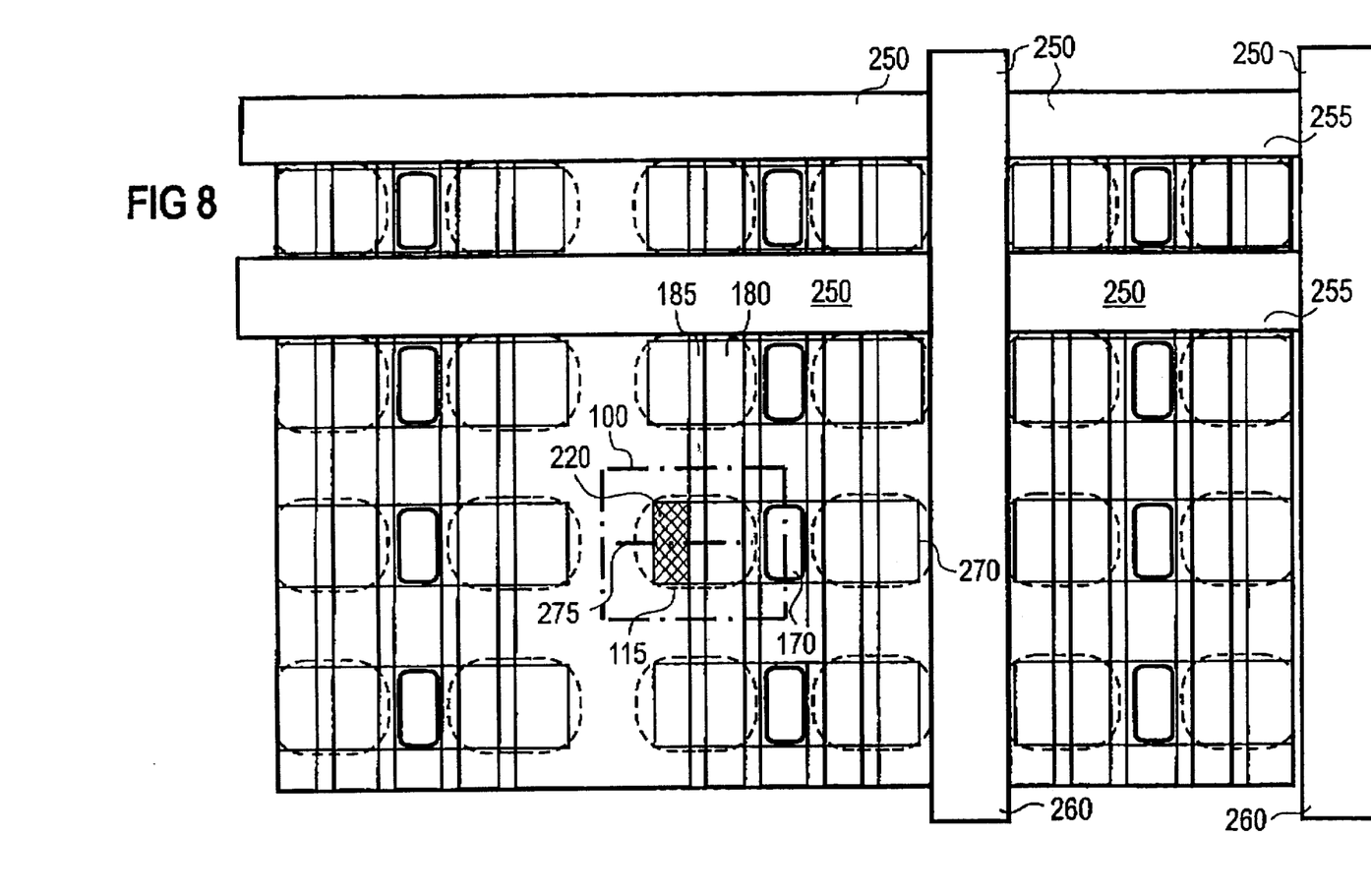
FIG. 8 shows the plan view of the exemplary embodiment of a DRAM memory cell array in accordance with FIG. 6.

FIG. 8 illustrates the memory cell arrangement according to FIG. 6 in plan view. The size of the memory cell 100 is 4 F$^2$ in this exemplary embodiment. The memory cell 100 comprises, inter alia, the trench 115 in which the trench capacitor 110 is situated. The first word line 180, which is surrounded by the first insulation encapsulation 185, runs across the trench 115. Arranged on one side of the first word line is the source region 170 and on the other side the drain region 165 and the self-aligned connection 220 in the contact trench 205. The trench insulation 250 runs between adjacent memory cells. The active region 270 is used for the processing of the transistors. In this exemplary embodiment the trench insulation 250 comprises a first trench insulation 255 running parallel to bit lines and it comprises a second trench insulation 260 running parallel to the word lines.

An epitaxial closing joint 275 is situated in the epitaxial layer 245, centrally about the trench 115.

The fabrication of the memory according to FIG. 6 will now be described with reference to FIG. 7. The fabrication of the memory cell arrangement according to the invention begins with the realization of the trench capacitor 110 in a 4 F$^2$ layout. In this case, firstly the trench 115 is etched into the substrate 105. The large insulation collar 150 is formed in the upper region 120 of the trench 115. The lower region around the trench 115 is then doped so as to form the buried plate 145. In the lower region 125 of the trench 115, the dielectric layer 140 is subsequently formed, the trench is filled with the conductive trench filling 130 and the buried well 155 is formed by the introduction of dopant. Afterwards, the conductive trench filling 130 is oxidized by means of thermal oxidation and the insulating covering layer 135 forms over the opening of the trench 115. This is done in a self-aligned manner since, at this point in time, the remainder of the substrate surface is covered by a hard mask which was used to pattern the trench 115.

The hard mask is subsequently removed, with the result that the surface 106 of the substrate 105 at this point in time is formed from the insulating covering layer 135, the large insulation collar 150 and the substrate 105. After the oxidation of a screen oxide layer, the buried well 155 is formed by the implantation of dopant. It connects the buried plates of the adjacent memory cells.

After the removal of the screen oxide layer, the substrate surface 106 is cleaned and the epitaxial layer 245 is grown selectively. In this case, the growth of the epitaxial layer 245 begins on the uncovered substrate 105 and completely grows over the trench 115 laterally from all directions, said trench being closed off by the insulating covering layer 135. In this case, an epitaxial closing joint 275 forms over the center of the insulating covering layer 135.

The trench insulation 250 is subsequently fabricated in two separate steps. First of all, the first trench insulation 255 running in the bit line direction is fabricated by a conventional technique in such a way that it terminates in a planar manner with the epitaxial layer 245 on the surface thereof.

The second trench insulation 260 is subsequently formed in the word line direction. To that end, a relatively thick mask stack is patterned and transferred by means of selective plasma etching to the epitaxial layer 245 and the substrate 105. The patterned trenches are subsequently filled with silicon oxide and etched back in a planar manner as far as the surface of the mask stack. The mask stack is subsequently removed selectively to leave the second trench insulation 260 shown in FIG. 7. In this case, the trench capacitor 110 is overlapped by the second trench insulation 260 to a point underneath the insulating covering layer 135 and the epitaxial layer 245 is removed in this region. Sacrificial spacer webs 265 made of silicon oxide are subsequently formed on the side walls of the second trench insulation 260. The first word line 180 with its first insulation encapsulation 185 is subsequently produced as a lateral edge web (spacer) on the spacer web 265. This is done by means of isotropic layer deposition and anisotropic selective etching back (spacer technique).

In this case, the first word line 180 is formed perpendicularly above the insulating covering layer 135, with the result that the transistor 160 is formed as a partial SOI transistor. The source region 170 is subsequently formed by means of implantation. The gap between the first word line 180 and the third word line 200, which is situated above the source region 170, is filled with an insulation filling 280. The second word line 190 is formed parallel to the first word line on an adjacent structure of the second trench insulation 260.

Afterwards, the superficially uncovered word lines 180, 190 and 200 are selectively etched back and the trenches produced by etching-back are filled with an insulation made of silicon nitride by means of layer deposition and planarization in order to complete the first and second insulation encapsulations 185 and 195.

With reference to FIG. 6, in a subsequent photolithographic step, the sacrificial spacer web 265 is uncovered and etched back selectively as far as the surface of the epitaxial layer 245 by means of plasma etching. In this case, the region in which the source region 170 is situated is masked. On account of a lower etching rate, the second trench insulation 260 is partly etched back at the same time. The drain region 165 is subsequently formed by implantation of dopant.

The self-aligned connection 220 is formed between the first trench insulation 255, the second trench insulation 260 and the first insulation encapsulation 185 of the first word line 180. The formation of the self-aligned connection 220 is done by using structures that are already present, and for this reason is referred to as self-aligned. In this case, the region in which the source region 170 is situated is masked with the stop layer 240.

To that end, anisotropic etching is used to etch the contact trench 205, which removes part of the drain region 165 and of the epitaxial layer 245 in this region. The selective etching stops on the insulating covering layer 135, composed of silicon oxide. The epitaxial closing joint 275 is removed by the etching of the contact trench 205.

The insulating covering layer 135 is removed at the bottom of the contact trench 205. This etching step is carried out selectively with respect to the first insulation encapsulation 185 and the trench insulation 250. The insulation collar 235 is subsequently formed by oxidation, silicon oxide deposition and anisotropic etching back (spacer technique). The conductive material 225 made of doped polysilicon is then deposited in the insulation collar 235.

The insulation collar 235 is subsequently etched back as far as the level of the drain region 165. After a cleaning step, the conductive cap 230 is deposited. The conductive cap 230 is formed from doped polysilicon in this exemplary embodiment. As a result, the conductive trench filling 130 is electrically connected to the drain region 165 via the conductive material 225 and the conductive cap 230. Furthermore, the insulation collar 235 is formed in such a way that neither the conductive trench filling 130, the conductive material 225 nor the conductive cap 230 have electrical contact with the epitaxial layer 245. This arrangement prevents leakage currents which could discharge the trench capacitor 110.

This concludes the formation of the self-aligned connection 220 and the memory cell arrangement is completed with the remaining functional elements, as is known from the prior art.

Figure 9A:
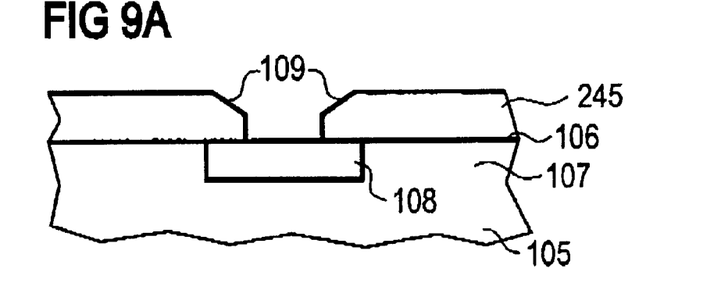
FIG. 9a shows an exemplary embodiment of an epitaxial layer.

FIG. 9a illustrates a substrate 105 having a monocrystalline region 107 and an electrically insulating region 108 on its surface 106. An epitaxial layer 245 is arranged on the monocrystalline region 107, said layer extending laterally at least partly over the electrically insulating region 108.

Figure 9B:
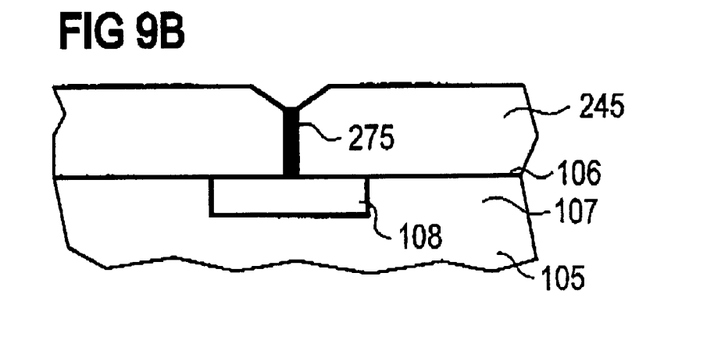
FIG. 9b shows the exemplary embodiment according to FIG. 9a at a later point in time with an epitaxial closing joint.

FIG. 9b differs from FIG. 9a to the effect that an epitaxial closing joint 275 is arranged between the growth fronts of the epitaxial layer.

Figure 9C:
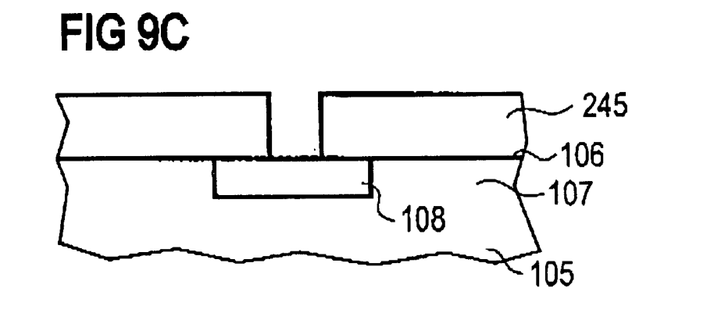
FIG. 9c shows the exemplary embodiment according to FIG. 9b at a later point in time, the epitaxial closing joint and part of the epitaxial layer having been removed.

In FIG. 9c, the epitaxial layer is partly planarized back and that region of the epitaxial layer 245 in which the epitaxial closing joint 275 was arranged has been at least partly removed.

Figure 9D:
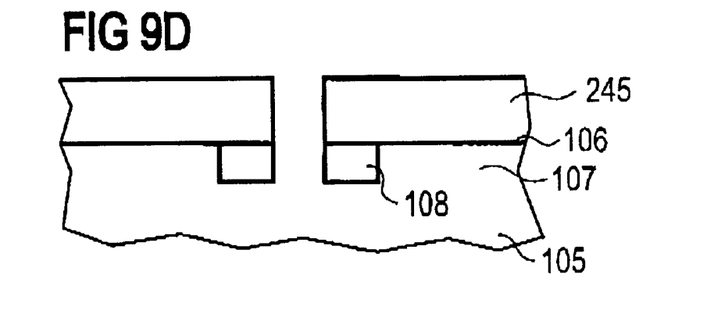
FIG. 9d shows the exemplary embodiment according to FIG. 9c at a later point in time, part of the electrically insulated region having been removed.

FIG. 9d differs from FIG. 9c in that the electrically insulating region 108 has been partly removed.

A method for fabricating an epitaxial layer is described with reference to FIG. 9. Beginning with FIG. 9a, a substrate 105 is provided, said substrate having a monocrystalline region 107 and an electrically insulating region 108 on its surface 106. In this case, the lateral boundary of the electrically insulating region 108 may be circular, elliptic, square, rectangular, or comprise corresponding mixed forms or arbitrary outlines.

The epitaxial layer 245 is subsequently grown. The epitaxial growth process is selective, with the result that the growth process, proceeding from the monocrystalline region 107, grows new monocrystalline material. In this case, no crystallization seeds are produced on the electrically insulating region 108, rather the electrically insulating region 108 is laterally overgrown by the monocrystalline silicon which grows on the monocrystalline region 107 of the substrate surface 106.

If the epitaxial growth process is continued, then the epitaxial closing joint 275 illustrated in FIG. 9b is produced. The epitaxial closing joint 275 may be a circular, punctiform, linear, undulating or arbitrarily curvilinear region. The epitaxial closing joint itself forms a grain boundary between adjacent monocrystalline epitaxial layers.

With reference to FIG. 9a, even though the growth fronts still do not touch, mention is nevertheless made of an epitaxial closing joint. FIGS. 9a and 9b indicate facets which are produced in the course of the epitaxial growth.

With reference to FIG. 9c, a planarization step and an etching-back step are carried out, removing facets 109 that were produced, for example. A region of the epitaxial layer 245 is subsequently removed, so that the epitaxial closing joint is at least partly removed.

With reference to FIG. 9d, the epitaxial layer is used as an etching mask for removing the electrically insulating region 108.

In a specific exemplary embodiment, the substrate 105 is silicon having a monocrystalline region 107. The electrically insulating region 108 is silicon oxide for example.

We claim:

1. A method for fabricating an epitaxial layer having the steps of:
   providing a substrate 105, on whose substrate surface 106 there are arranged, at least partly uncovered, a monocrystalline region 107 and at least one electrically insulating region 108 adjoining the latter, the electrically insulating region 108 being at least partly surrounded by the monocrystalline region 107;
   growing an epitaxial layer 245 on the monocrystalline region 107 of the substrate surface 106, the electrically insulating region 108 being at least partly overgrown laterally by the epitaxial layer 245 and an epitaxial closing joint 275 forming above the electrically insulating region 108 on account of the overgrowth;
   at least partly removing the epitaxial layer 245 above the electrically insulating region 108, with the result that the epitaxial closing joint 275 is at least partly removed as well in the process.

2. The method as claimed in claim 1, characterized in that the epitaxial layer 245 is removed by anisotropic etching.

3. The method as claimed in either of claims 1 and 2, characterized in that the monocrystalline region 107 is composed of silicon and the electrically insulating region 108 is composed of silicon oxide.

4. The method as claimed in one of claims 1 to 3, characterized in that the electrically insulating region 108 is removed in the region in which the epitaxial layer has been removed.

5. A method of fabricating an epitaxial layer, which comprises:
   providing a substrate having:
      a substrate surface with an at least partly uncovered monocrystalline region; and
      at least one electrically insulating region adjoining the monocrystalline region and being at least partly surrounded by the monocrystalline region;
   growing an epitaxial layer on the monocrystalline region;
   at least partly overgrowing the at least one electrically insulating region laterally with the epitaxial layer and thereby forming an epitaxial closing joint above the at least one electrically insulating region due to the overgrowth; and
   at least partly removing the epitaxial layer above the at least one electrically insulating region and thereby also at least partly removing the epitaxial closing joint.

6. The method according to claim 5, which further comprises performing the removing step by removing the epitaxial layer by anisotropic etching.

7. The method according to claim 5, which further comprises performing the removing step by at least partly removing the epitaxial layer by anisotropic etching.

8. The method according to claim 5, wherein the monocrystalline region is made of silicon and the at least one electrically insulating region is made of silicon oxide.

9. The method according to claim 5, which further comprises removing the at least one electrically insulating region in a region in which the epitaxial layer has been removed.

10. A method of fabricating an epitaxial layer, which comprises:
   forming an at least partly uncovered monocrystalline region and at least one electrically insulating region adjoining the monocrystalline region at a surface of a substrate, the monocrystalline region at least partly surrounding the at least one electrically insulating region;
   growing an epitaxial layer on the monocrystalline region;
   at least partly overgrowing the at least one electrically insulating region laterally with the epitaxial layer and thereby forming an epitaxial closing joint above the at least one electrically insulating region due to the overgrowth; and
   at least partly removing the epitaxial layer above the at least one electrically insulating region and thereby also at least partly removing the epitaxial closing joint.

* * * * *

UNITED STATES PATENT AND TRADEMARK OFFICE
CERTIFICATE OF CORRECTION

PATENT NO. : 6,326,262 B1
DATED : December 4, 2001
INVENTOR(S) : Dietmar Temmler et al.

It is certified that error appears in the above-identified patent and that said Letters Patent is hereby corrected as shown below:

<u>Title page, Item [54], and Column 1, lines 1-2,</u>
Title should read as follows: -- EPITAXY LAYER AND METHOD FOR ITS PRODUCTION --

Signed and Sealed this

Thirteenth Day of August, 2002

*Attest:*

*Attesting Officer*

JAMES E. ROGAN
*Director of the United States Patent and Trademark Office*